United States Patent

Huang et al.

(10) Patent No.: US 12,456,649 B2
(45) Date of Patent: Oct. 28, 2025

(54) SEMICONDUCTOR DEVICE AND METHODS OF MANUFACTURING THEREOF

(71) Applicant: TAIWAN SEMICONDUCTOR MANUFACTURING COMPANY, LTD., Hsinchu (TW)

(72) Inventors: Tsai-Ming Huang, Zhubei (TW); Wei-Chieh Huang, Zhudong Township (TW); Hsun-Chung Kuang, Hsinchu (TW); Yen-Chang Chu, Tainan (TW); Cheng-Che Chung, Hualien County (TW); Chin-Wei Liang, Zhubei (TW); Ching-Sen Kuo, Taipei (TW); Jieh-Jang Chen, Zhubei (TW); Feng-Jia Shiu, Jhudong Township (TW); Sheng-Chau Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 553 days.

(21) Appl. No.: 17/360,784

(22) Filed: Jun. 28, 2021

(65) Prior Publication Data

US 2021/0327748 A1 Oct. 21, 2021

Related U.S. Application Data

(63) Continuation of application No. 16/584,594, filed on Sep. 26, 2019, now Pat. No. 11,049,767.
(Continued)

(51) Int. Cl.
*H01L 21/768* (2006.01)
*H01L 21/02* (2006.01)
(Continued)

(52) U.S. Cl.
CPC .... *H01L 21/7684* (2013.01); *H01L 21/02074* (2013.01); *H01L 21/31058* (2013.01);
(Continued)

(58) Field of Classification Search
CPC ......... H01L 23/544; H01L 2223/54426; H01L 21/76831; H01L 21/02074; H01L 21/76883; H01L 21/7684; H01L 23/5386
See application file for complete search history.

(56) References Cited

U.S. PATENT DOCUMENTS 5,998,226 A * 12/1999 Chan .................. H01L 22/34
438/10
6,140,233 A 10/2000 Kwag et al.
(Continued)

FOREIGN PATENT DOCUMENTS

CN 102945842 A 2/2013
CN 103839917 A 6/2014
(Continued)

OTHER PUBLICATIONS

K. Fischer and R. Suss, "Spray coating—a solution for resist film deposition across severe topography," IEEE/CPMT/SEMI 29th International Electronics Manufacturing Technology Symposium (IEEE Cat. No. 04CH37585), San Jose, CA, USA, 2004, pp. 338-341, doi: 10.1109/IEMT.2004.1321686. (Year: 2004).*
(Continued)

*Primary Examiner* — Vincent Wall
(74) *Attorney, Agent, or Firm* — STUDEBAKER BRACKETT PLLC

(57) ABSTRACT

In a method of manufacturing a semiconductor device, a first interlayer dielectric (ILD) layer is formed over a substrate, a chemical mechanical polishing (CMP) stop layer is formed over the first ILD layer, a trench is formed by patterning the CMP stop layer and the first ILD layer, a metal layer is
(Continued)

formed over the CMP stop layer and in the trench, a sacrificial layer is formed over the metal layer, a CMP operation is performed on the sacrificial layer and the metal layer to remove a portion of the metal layer over the CMP stop layer, and a remaining portion of the sacrificial layer over the trench is removed.

20 Claims, 7 Drawing Sheets

Related U.S. Application Data

(60) Provisional application No. 62/753,908, filed on Oct. 31, 2018.

(51) Int. Cl.
  *H01L 21/3105* (2006.01)
  *H01L 21/321* (2006.01)
  *H01L 23/522* (2006.01)
  *H01L 23/544* (2006.01)

(52) U.S. Cl.
  CPC .... *H01L 21/3212* (2013.01); *H01L 21/76802* (2013.01); *H01L 21/76831* (2013.01); *H01L 21/76883* (2013.01); *H01L 23/5226* (2013.01); *H01L 23/544* (2013.01); *H01L 2221/1063* (2013.01); *H01L 2223/54426* (2013.01)

(56) References Cited

U.S. PATENT DOCUMENTS

| | | | | |
|---|---|---|---|---|
| 6,599,809 | B2 | 7/2003 | Anma et al. | |
| 7,118,833 | B2 * | 10/2006 | Elenius | G03F 1/50 |
| | | | | 430/311 |
| 7,402,908 | B2 * | 7/2008 | Gambee | H01L 21/32134 |
| | | | | 257/E21.309 |
| 7,485,956 | B2 * | 2/2009 | Tuckerman | H01L 23/06 |
| | | | | 257/E23.083 |
| 9,368,460 | B2 * | 6/2016 | Yu | H01L 23/5389 |
| 11,004,796 | B2 * | 5/2021 | Tu | H01L 24/19 |
| 11,049,767 | B2 * | 6/2021 | Huang | H01L 21/7684 |
| 11,281,094 | B2 * | 3/2022 | Gouk | G03F 7/038 |
| 2002/0072195 | A1 * | 6/2002 | Anma | H01L 21/7684 |
| | | | | 257/E21.546 |
| 2005/0014360 | A1 * | 1/2005 | Yu | H01L 21/76849 |
| | | | | 438/622 |
| 2005/0087838 | A1 * | 4/2005 | Hsin | H01L 23/5223 |
| | | | | 257/532 |
| 2006/0276034 | A1 * | 12/2006 | Blanchard | H01L 21/76834 |
| | | | | 257/E43.006 |
| 2009/0026614 | A1 * | 1/2009 | Jung | H01L 25/0657 |
| | | | | 257/738 |
| 2009/0224364 | A1 * | 9/2009 | Oh | H01L 24/29 |
| | | | | 257/E21.705 |
| 2013/0285125 | A1 | 10/2013 | Chen et al. | |
| 2020/0135538 | A1 * | 4/2020 | Huang | H01L 21/02074 |

FOREIGN PATENT DOCUMENTS

| | | |
|---|---|---|
| EP | 0930647 A1 | 7/1999 |
| TW | 400619 B | 8/2000 |
| TW | 508735 B | 11/2002 |
| TW | 201344918 A | 11/2013 |
| TW | 201611110 A | 3/2016 |
| TW | 201724279 A | 7/2017 |

OTHER PUBLICATIONS

Ji et al., A metallic buried interconnect process for through-wafer interconnection, J. micromech. micoreng. 18 (2008) 085016 (10pp) (Year: 2008).*

*Rai Strategic Holdings, Inc. v. Philip Morris Prod. S.A.*, 92 F.4th 1085 (2024) (Year: 2024).*

Analytical Sample Preparation, 2003, Force, Hoolam Ed. 224.

Office Action issued in corresponding Chinese Patent Application No. 201911051128.X dated Jan. 13, 2022.

Non-Final Office Action issued in U.S. Appl. No. 16/584,594, dated Oct. 23, 2020.

Notice of Allowance issued in U.S. Appl. No. 16/584,594, dated Feb. 26, 2021.

* cited by examiner

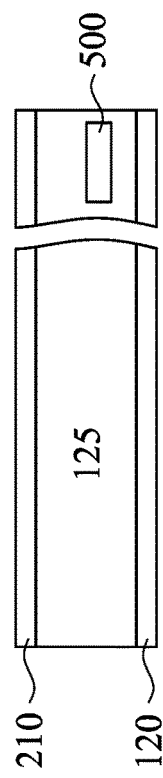
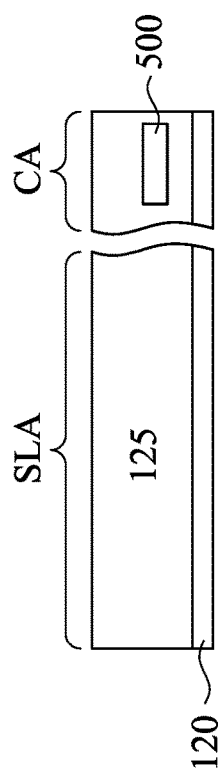
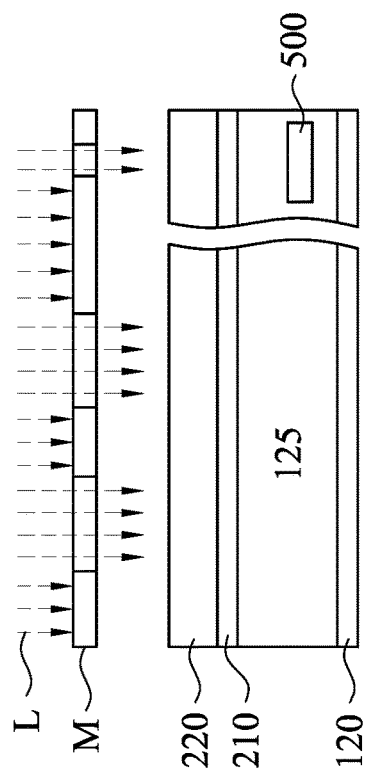
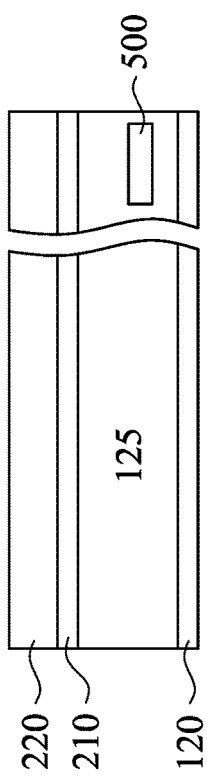
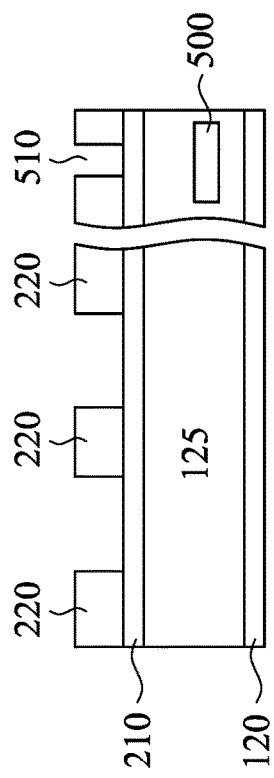
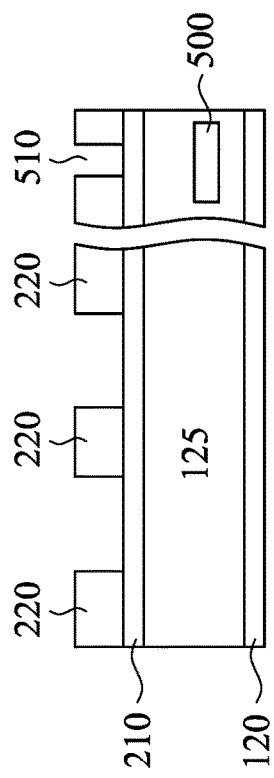

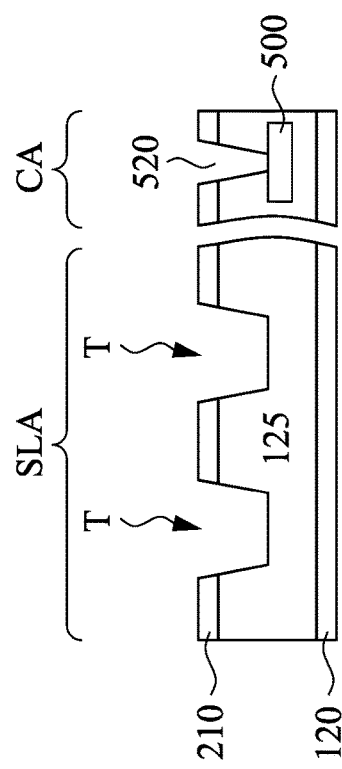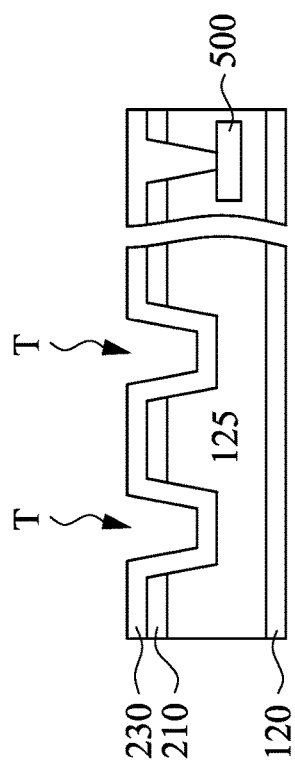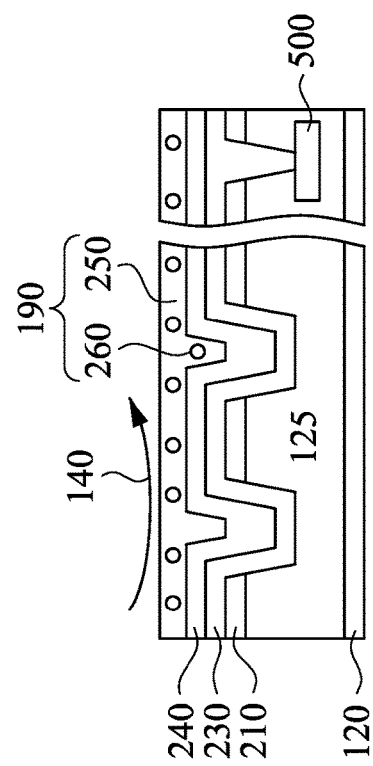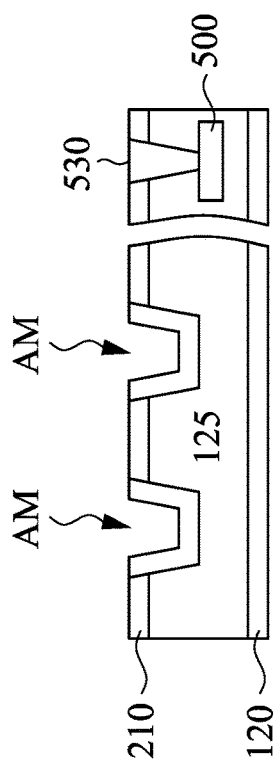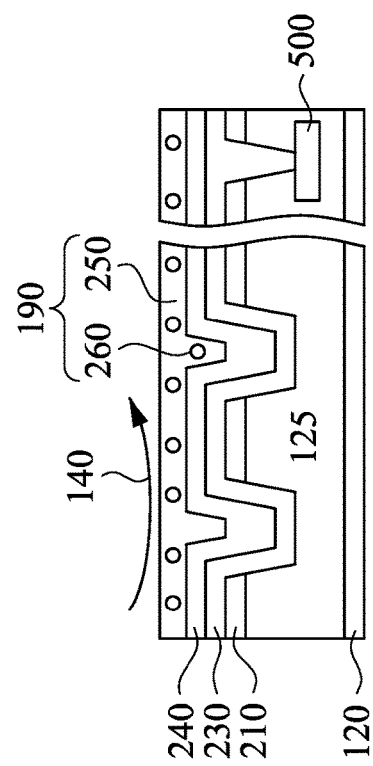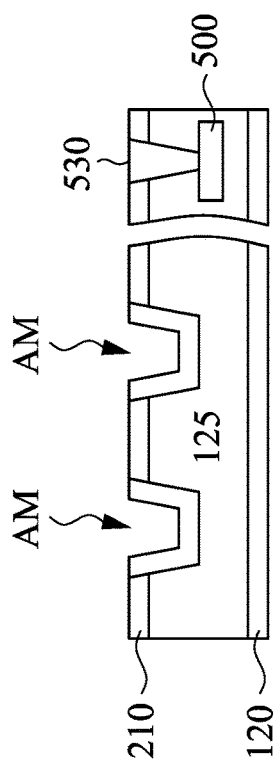

SEMICONDUCTOR DEVICE AND METHODS OF MANUFACTURING THEREOF

RELATED APPLICATIONS

This application is a continuation of U.S. application Ser. No. 16/584,594 filed Sep. 26, 2019, now U.S. Pat. No. 11,049,767, which claims priority to U.S. Provisional Patent Application No. 62/753,908 filed on Oct. 31, 2018, the entire disclosure of each of which is incorporated herein by reference.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. One of the key technologies for the nanometer technology process nodes is a planarization process, such as chemical mechanical polishing (CMP), performed on one or more layers formed by deposition. Therefore, improvement of the CMP process is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8, 9, 10, 11, 12, 13, 14, and 15 show sequential cross-sectional views of a method for manufacturing a semiconductor device, according to some embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

During the manufacturing process of a semiconductor device such as a field effect transistor (FET) device having source/drain epitaxial layers, planarization of a surface is carried out to polish the surface so as to avoid dishing defects and to remove unwanted materials. Metals, such as the metals used to form alignment marks in photolithography, are planarized. The planarization is usually carried out by a process called chemical mechanical polishing (CMP). During planarization by the CMP process, the surface of metal parts may be curved and thus may not be planarized as desired, thereby causing inaccuracy in alignment by those defected alignment marks. The present application discloses a method to solve the above-mentioned problem.

Figure 1:
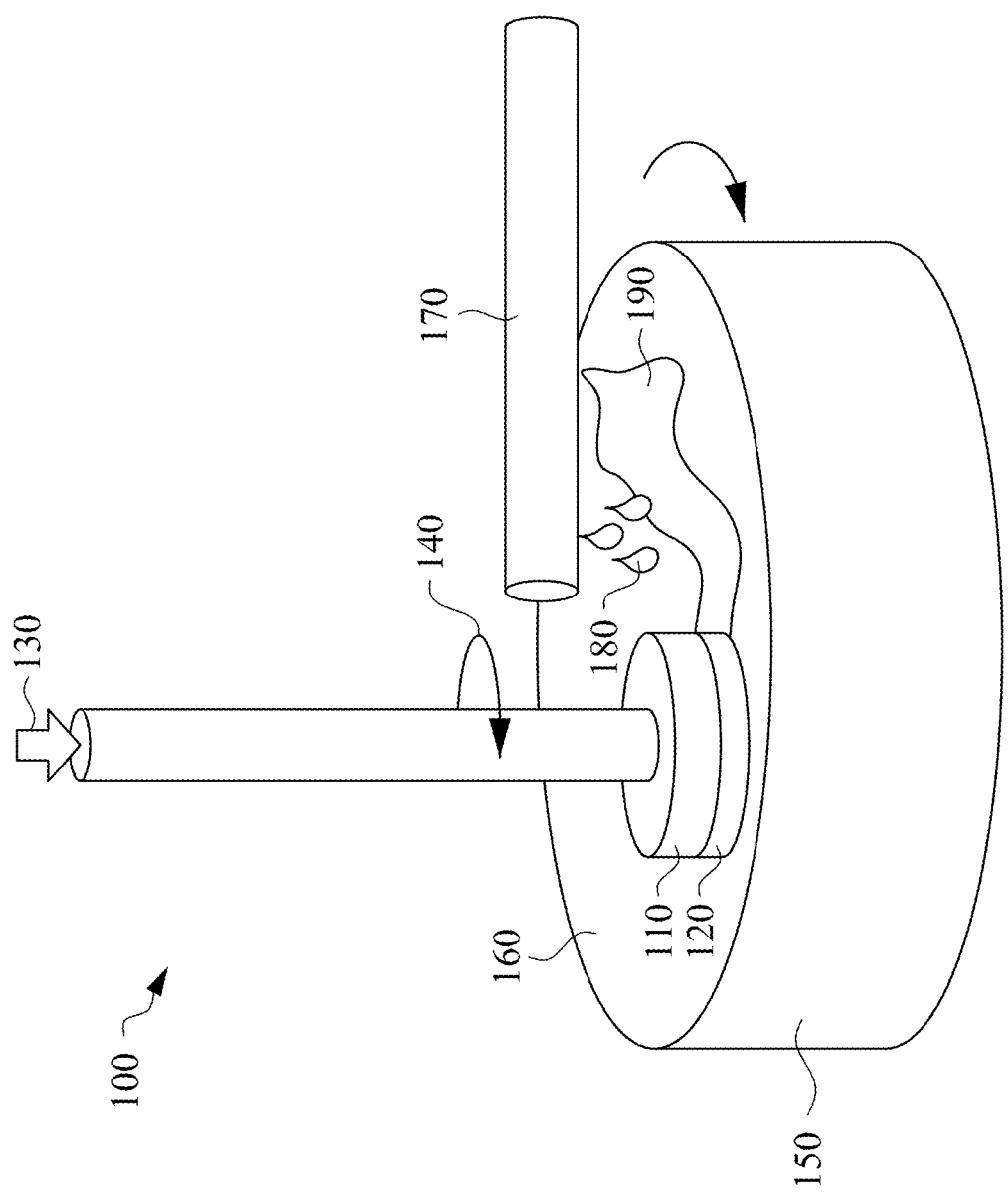
FIG. 1 shows a schematic view of a chemical and mechanical polishing (CMP) operation of a substrate, according to an embodiment of the present disclosure.

FIG. 1 shows a schematic view of a CMP operation of a substrate, according to an embodiment of the present disclosure. The apparatus 100 for the CMP operation includes a wafer carrier 110 holding a wafer or a sample 120. A downward force 130 is applied to the wafer carrier 110 which rotates in a direction 140. The wafer or sample 120 rotates with the wafer carrier 110. The apparatus 100 also includes a slurry dispenser 170 supplying a slurry 180 onto a polishing pad 160 on a rotating plate 150. The slurry 180 on the polishing pad 160 becomes polishing slurry 190 flowing to the wafer or sample 120.

During polishing, the rotating plate 150 has a rotational speed of about 10 to about 70 rpm; the wafer carrier 110 rotates at a speed of about 25 to about 90 rpm; and the pressure applied to the wafer from the downward force 130 is about 2 to about 20 psi, according to some embodiments of the present disclosure.

The material removal rate is defined by the following equation:

$$\frac{dh}{dt} \propto pv \qquad \text{Eq. (1)}$$

where h is the thickness of the layer being polished and removed, t is polishing duration, p is applied pressure, v is relative velocity of rotation. By calibration, the proportionality constant of Eq. (1) can be determined and the proportionality constant depends on the material of the layer being polished by CMP, hardness of the material being polished, stiffness of the polishing pad, size of the abrasive particles, roughness of the polishing pad, sample surface roughness, and slurry concentration between the wafer and the polishing pad.

The slurry includes an oxidizing agent, a catalyst, abrasive particles, and a stabilizer. The oxidizing agent includes compounds having a peroxy group or a compound containing an element in its highest oxidation state. Examples of the oxidizing agent include hydrogen peroxide and its adducts such as urea hydrogen peroxide and percarbonates, organic peroxides such as benzol peroxide, peracetic acid, and di-t-butyl peroxide, monopersulfates, dipersulfates, and sodium peroxide, according to some embodiments of the present disclosure.

The catalyst in the slurry includes a metal compound having multiple oxidation states such as Ag, Co, Cr, Cu, Fe, Mo, Mn, Nb, Ni, Os, Pd, Ru, Sn, Ti, and V, according to some embodiments of the present disclosure. The amount of the catalyst depends on the amount of the oxidizing agent.

The abrasive includes metal oxide abrasive including alumina, titania, zirconia, germania, silica, ceria, and mixtures thereof. The amount of abrasive particles depends on the amount of the slurry, and could be in a range of about 1.0 to about 20.0 wt %. The abrasive particles are formed by a sol-gel, hydrothermal or plasma process, according to some embodiments of the present disclosure. The size distribution of the abrasive particles is less than about 1 μm with a mean aggregate diameter less than about 0.4 μm. In a particular embodiment, the abrasive material in the slurry is silica or alumina in the slurry with a pH value between about 8 and about 11.

The stabilizer includes a phosphoric acid, organic acids (such as adipic, citric, malonic, orthophthalic, and EDTA), phosphonate compounds, nitrites, and other ligands and mixture thereof, according to some embodiments of the present disclosure.

FIGS. 2-14 show a sequential process for manufacturing a semiconductor device according to an embodiment of the present disclosure. It is understood that additional operations can be provided before, during, and after processes shown by FIGS. 2-14, and some of the operations described below can be replaced or eliminated, for additional embodiments of the method. The order of the operations/processes may be interchangeable. FIGS. 2-14 show cross-sectional views of operations of a method for processing a semiconductor device, according to some embodiments of the present disclosure.

In the following manufacturing operations, a circuit area CA and a peripheral area, such as a scribe lane area SLA, are processed to form a circuit pattern (e.g., a via hole or via contact) and an alignment mark used to align a photo mask to a circuit pattern already formed.

As shown in FIG. 2, one or more first interlayer dielectric (ILD) layers 125 is formed over substrate 120. The substrate 120 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 120 is made of Si. The substrate 120 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 120 comprises silicon germanium (SiGe) buffer layers epitaxially grown on the silicon substrate 120. The germanium concentration of the SiGe buffer layers may increase from about 30 atomic % germanium for the bottom-most buffer layer to about 70 atomic % germanium for the top-most buffer layer. In some embodiments of the present disclosure, the substrate 120 includes various regions that have been suitably doped with impurities (e.g., p-type or n-type conductivity). In some embodiments, one or more electric devices, such as a transistor, is formed on the substrate 120 and the first ILD layer 125 covers the electric devices. The dielectric or insulating material for the first ILD layer 125 includes silicon oxide, silicon nitride, silicon oxynitride (Si—O—N), silicon carbon nitride (Si—C—N), silicon carbon oxynitride (Si—C—O—N), fluorine-doped silicate glass (FSG), or a low-k dielectric material, formed by LPCVD (low pressure chemical vapor deposition), plasma-CVD, flowable CVD or any other suitable film formation methods. In some embodiments, one or more metal wiring layers 500 are disposed in the first ILD layer 125 in the circuit area CA. In some embodiments, the wiring layer 500 is made of Cu or a Cu alloy. In some embodiments, one or more wiring layers are formed below the wiring layer 500. In other embodiments, an opening is connected to one of the electric devices, for example, a gate or a source/drain of a transistor, formed on the substrate 120.

As shown in FIG. 3, in some embodiments, a CMP stop layer 210 is deposited over the first ILD layer 125. The CMP stop layer 210 includes silicon-rich oxide, silicon carbide, or any other suitable material. The CMP stop layer 210 can be formed by CVD, atomic layer deposition (ALD) or any other suitable film formation methods. A thickness of the CMP stop layer 210 is in a range from about 20 nm to about 500 nm in some embodiments, and is in a range from about 50 nm to about 200 nm in other embodiments.

Then, as shown in FIG. 4, a photoresist layer 220 is formed on the CMP stop layer 210. Subsequently, as shown in FIG. 5, one or more photo lithography operations are performed to pattern the photoresist layer 220. The photolithography operation uses a mask M having transparent areas for light L to pass through. FIG. 6 shows that the portions 220' of the photoresist layer 220 are chemically changed by the light L and are to be removed by a developer. The photo lithography operation includes a deep ultra violet (DUV) lithography operation or an EUV (extreme UV) lithography operation. In certain embodiments, an electron beam lithography is used instead of or in addition to the photo lithography operation.

In some embodiments, the patterns 220' correspond to alignment marks to be used in one or more subsequent lithography operations. In some embodiments, the mask M includes patterns for the alignment mark disposed in a scribe lane area SLA and patterns for desired circuit, such as via holes, in the circuit area CA. A dimension of the alignment marks in plan view (i.e., width and/or length) is in a range from about 100 nm to about 10 μm in some embodiments. In some embodiments, the alignment marks are rectangular patterns or square pattern arranged in a matrix, or line-and-space patterns. In FIG. 6, the portions 220 that are not exposed by the light L, which is blocked by the mask M, remain on the CMP stop layer 210 after developing the exposed photo resist layer, as shown in FIG. 7. The portions 220 of the photoresist layer 210 remaining are used as a mask for etching the CMP stop layer 210 and the first ILD layer 125. The result of the etching operation is shown in FIG. 8.

As shown in FIG. 8, one or more etching processes remove portions of the CMP stop layer 210 and portions of the first ILD layer 125, not covered by the resist patterns 220, thereby forming trenches T. In some embodiments, a depth of trench T from the upper surface of the CMP stop layer 210 is in a range from about 50 nm to about 1000 nm. In the circuit area CA, an opening 520, at the bottom of which the wiring layer 500 is exposed, for a via contact is formed as shown in FIG. 8 in some embodiments. In other embodiments, the opening 520 is a trench for a wiring pattern.

Then, one or more metal layers 230 are formed on the remaining CMP stop layer 210 and the trenches T, as shown in FIG. 9. In FIG. 9, the metal layer 230 is conformally formed and does not fully fill the trenches T, in some embodiments. Thus, the metal layer 230 has a concave portion having a bottom portion and sidewall portion in the trench as shown in FIG. 9 in some embodiments. The metal layer 230 includes one or more layers of copper, aluminum, titanium, tungsten, nickel, cobalt, tantalum and an alloy thereof, TiN and TaN in some embodiments. The metal layer 230 can be formed by CVD, physical vapor deposition (PVD) including sputtering, electro-plating, ALD, or any other suitable film formation methods. A thickness of the metal layer 230 is in a range from about 50 nm to about 500 nm in some embodiments. In the circuit area CA, the opening 520 for the via contact is fully filled with the metal layer 230 due to the small dimension (e.g., diameter) of the opening 520.

Next, as shown in FIG. 10, a CMP sacrificial layer 240 is formed on the metal layer 230. In some embodiments, the CMP sacrificial layer 240 includes one or more organic layers. The CMP sacrificial layer 240 includes a photo resist layer, a bottom anti-reflection coating (BARC) layer or any other suitable material that can be removed selectively to the metal layer 230 and the CMP stop layer 210. The organic material can be formed over the substrate 120 by a spin-coating method or any other suitable method. In some embodiments, a baking operation is performed after the organic material is spin-coated to remove solvent. A thickness of the CMP sacrificial layer 240 is such that the height of the lowest upper surface of the CMP sacrificial layer 240 at the trench T (e.g., at the center of the trench) is equal to or higher than the upper surface of the CMP stop layer 210 in some embodiments. The thickness of the CMP sacrificial layer 240 is in a range from about 50 nm to about 500 nm in some embodiments, and is in a range from about 100 nm to about 300 nm in other embodiments. In some embodiments, the CMP sacrificial layer 240 is substantially conformally formed to have a concave portion over the trench T as shown in FIG. 10.

FIG. 11 shows a CMP operation using a slurry 190 having abrasive particles 260 and a liquid 250. The rotation direction of the CMP operation is indicated by the arrow 140. The abrasive particles 260 include an inorganic oxide, such as silica and alumina.

FIG. 12 shows the result of the CMP operation in FIG. 11. The CMP operation substantially stops at the CMP stop layer 210. In some embodiments, the CMP stop layer 210 is slightly etched and the etching of the CMP stop layer is detected and then the CMP operation is stopped in response to the detection of the etching of the CMP stop layer 210. In other embodiments, exposing the CMP stop layer 210 is detected by, for example, an optical measurement, and the CMP operation is stopped in response to the detection of the exposure of the CMP stop layer 210.

As shown in FIG. 12, a portion of the CMP sacrificial layer 240 on the CMP stop layer 210 and a portion of the metal layer 230 are removed. In some embodiments, a portion of the metal layer 230 and a portion of the CMP sacrificial layer 240 remain inside the space of the trench T. In some embodiments, the upper surface of the remaining CMP sacrificial layer 240 is flush with the upper surface of the CMP stop layer 210 and/or the upper surface of the remaining metal layer 230. In the circuit area CA, a via contact 530 is formed as shown in FIG. 12. In some embodiments, no CMP sacrificial layer 240 remains in the circuit area CA.

Then, as shown in FIG. 13, the remaining CMP sacrificial layer 240 in the trench T is removed by a removal process, selective to the metal layer 230 and the CMP stop layer 210, thereby forming the alignment marks AM. When the CMP sacrificial layer 240 is made of an organic material, an ashing operation, such as a plasm ashing process using a gas containing oxygen (e.g., 02 plasma, ozone plasma), can be used in some embodiments. After the plasma ashing operation, a wet cleaning operation is performed in some embodiments. In other embodiments, a wet removal operation using an organic solvent is used to selectively remove the CMP sacrificial layer 240 made of an organic material. In other embodiments, a solution containing $H_2O$, $NH_4OH$, and $H_2O_2$ and/or a solution containing $H_2O$, HCl and $H_2O_2$ are used to remove the remaining CMP sacrificial layer 240.

Figure 15:
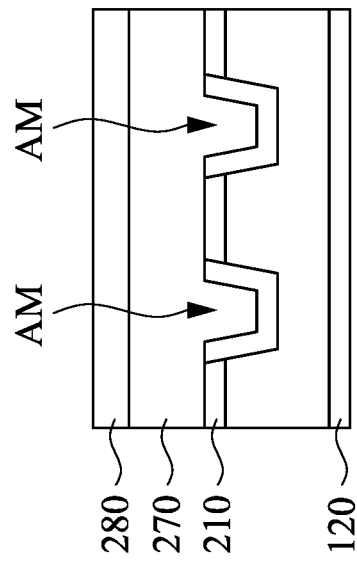
Figure 14:
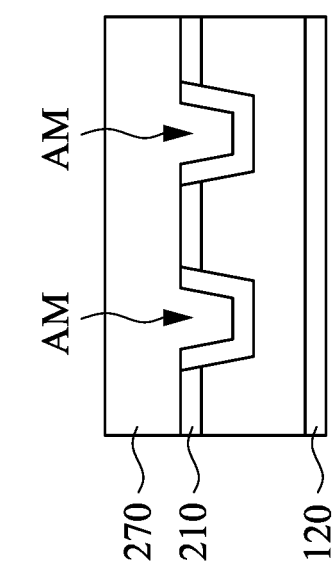

Further, as shown in FIG. 14, one or more second ILD layer 270 is formed over the CMP stop layer 210 and the alignment marks AM. In FIGS. 14 and 15, the circuit area is omitted. The material of the second ILD layer 270 is the same as the material of the first ILD layer 125 in some embodiments.

Then, a photo resist layer 280 is formed over the second ILD layer 270 as shown in FIG. 15 and a photo lithography operation is performed to pattern the photo resist layer 280 using the alignment marks AM as an alignment key. In some embodiments, the alignment marks AM are read by a laser light of a lithography apparatus and reflected laser light (alignment signal) is detected to determine the relative location of the alignment marks AM and then wafer alignment operation is performed by the lithography apparatus.

Figure 16B:
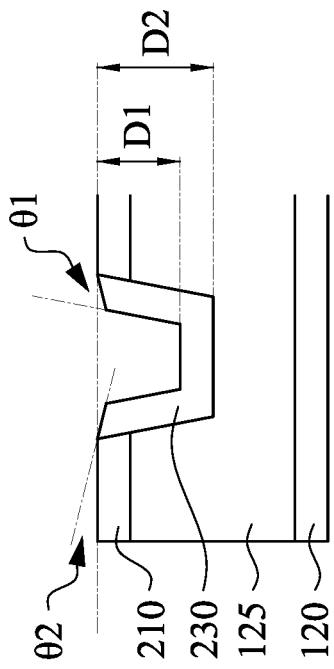
FIGS. 16A and 16B show alignment marks according to embodiments of the present disclosure.
Figure 16A:
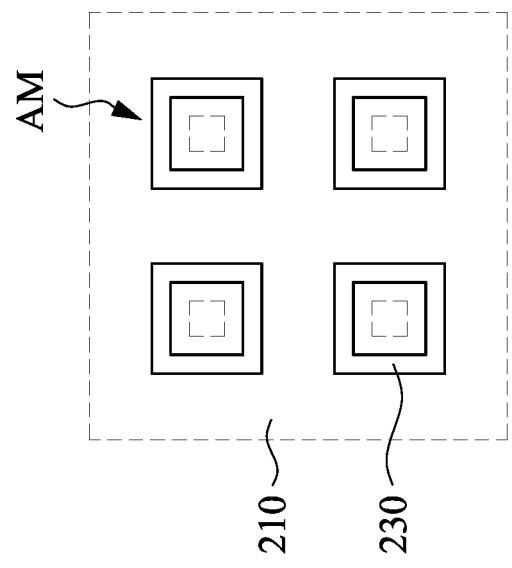

FIG. 16A shows a plan view of the alignment marks AM, and FIG. 16B shows an enlarged cross sectional view of the alignment marks AM in some embodiments. In some embodiments, the alignment marks AM are arranged in a matrix. In some embodiments, the alignment mark AM has a U-shape cross section having a bottom part and sidewall parts. In some embodiments, the depth D1 from the upper surface of the CMP stop layer 210 to an upper surface of the bottom part of the U-shape metal layer 230 in the trench is in a range from about 50 nm to about 500 nm in some embodiments. In other embodiments, the depth D1 is in a range from about 100 nm to about 300 nm. The depth D2 from the upper surface of the CMP stop layer 210 to the bottommost portion of the metal layer 230 is in a range from about 50 nm to about 1000 nm in some embodiments, and is in a range from about 150 nm to about 500 nm in other embodiments.

During the removal process, because the CMP sacrificial layer 240 fills the trench T, the planarization by the CMP process is substantially uniform, thereby suppressing a dishing problem. In some embodiments, an angle θ1 between the upper surface of the sidewall of the metal layer 230 and the sidewall of the metal layer 230 formed in the trench T has a larger angle. In some embodiments, the angle θ1 is in a range from about 50 degrees to about 90 degrees, and in other embodiments, the angle θ1 is in a range from about 60 degrees to 80 degrees. When the angle θ1 is larger (closer to 90 degrees), better alignment signals (e.g., stronger and/or less noise) can be obtained from the alignment mark formed by the metal layer 230 in the trench T. In some embodiments, the top of the sidewall part of the metal layer 230 formed in the trench T has a flatter and more horizontal surface. An angle θ2 between the upper surface of the sidewalls of the metal layer 230 and the plane parallel to the surface of the substrate 120 (or the upper surface of the CMP stop layer 210) is in a range from about 0 degrees (flat) to about 10 degrees inclined toward the trench center, in some embodiments. The angle θ2 is more than 0 degrees and less than 5 degrees in other embodiments. When the angle θ2 is smaller (closer to zero), better alignment signals can be obtained from the alignment mark formed by the metal layer 230 in the trench T. In addition, since the edges of the metal layer 230 are not excessively polished, a larger step height can be obtained. When the step height is larger, better alignment signals can be obtained from the alignment mark formed by the metal layer 230 in the trench T. Moreover, since the trenches T are filled with the CMP sacrificial layer 240, abrasive particles 260 are prevented from remaining in the trenches, which further improves the quality of the alignment marks.

Figure 17:
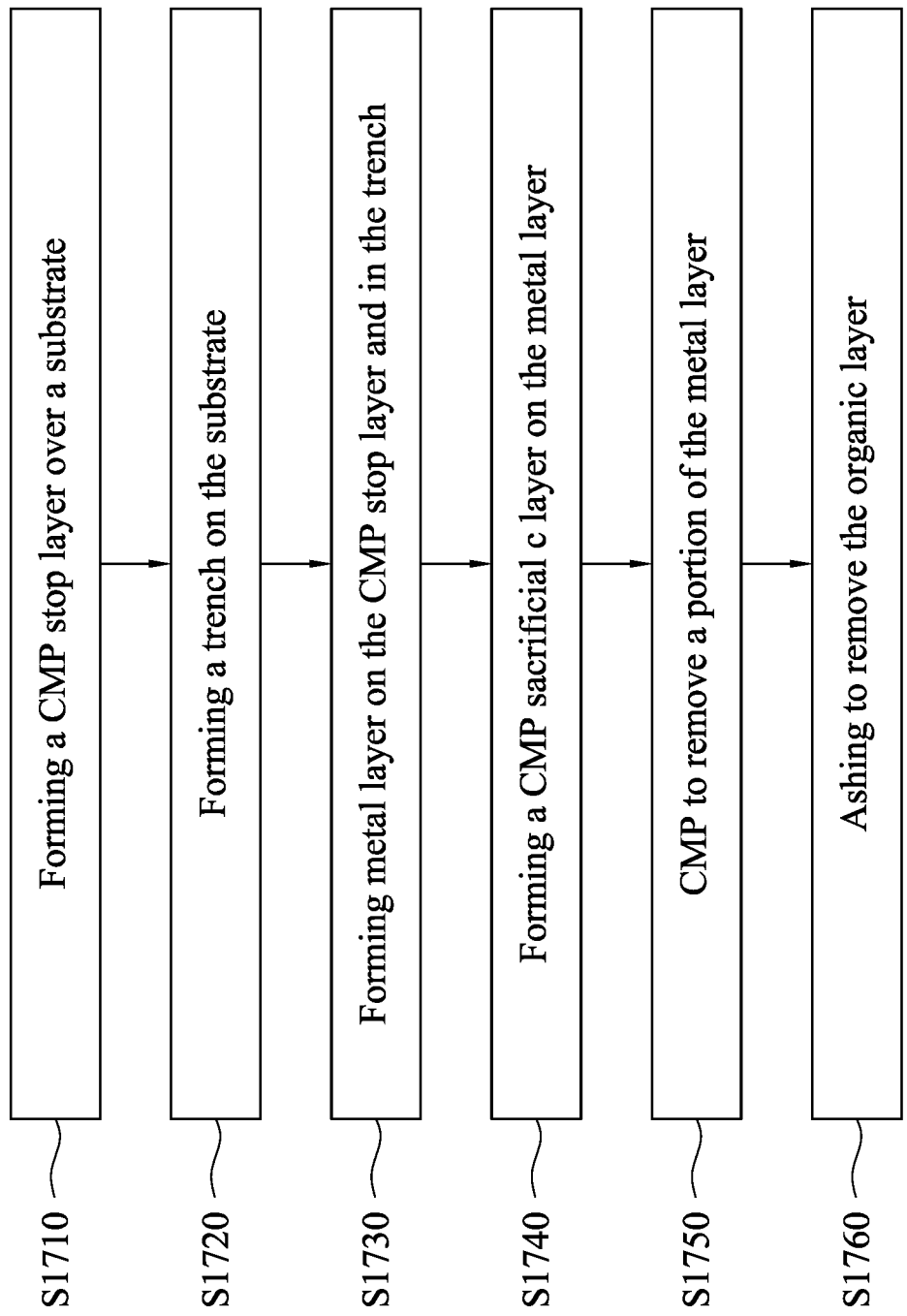
FIG. 17 shows a process flow of the operations shown in FIGS. 2-15.

FIG. 17 shows a process flow of the operations shown in FIGS. 6 to 15. FIG. 17 shows a process flow including an operation S1710 for forming a CMP stop layer over a substrate. Then, operation S1720 is carried out to form a trench on the substrate by one or more lithography and etching operations. Operation S1730 is carried out to form a metal layer on the CMP stop layer and in the trench. Next, operation S1740 is carried out to form a CMP sacrificial layer on the metal layer. Operation S1750 is sequentially carried out to perform a CMP to remove a portion of the metal layer and a portion of the CMP sacrificial layer. Finally, operation S1760 is carried out to remove the CMP sacrificial layer. It is understood that the structure shown in FIG. 15 undergoes further CMOS processes to form various features such as contacts/vias, interconnect metal layers, dielectric layers, passivation layers, etc.

In the forgoing embodiments, an organic material is used as a CMP sacrificial layer to cover the metal layer 230, because an organic layer can be easily removed by a plasma ashing process using an oxygen containing gas or a wet process using an organic solvent, with a high selectivity against the metal layer 230 and the CMP stop layer 210. However, any other material can be used as a CMP sacrificial layer instead of an organic layer to cover the metal layer 230, as long as the CMP sacrificial layer is selectively removed against the metal layer 230 and the CMP stop layer 210.

In some embodiments, the remaining CMP sacrificial layer 420 over the trench T is not removed and the second ILD layer 270 is formed over the remaining CMP sacrificial layer 420. In particular, when the contrast between the metal layer 230 and the CMP stop layer 210 is sufficiently high or the step height D1 is sufficient high, influence of the remaining sacrificial layer 240 over the trench on the alignment layer of the lithography apparatus may be small.

FIGS. 18-22 show processes for manufacturing a semiconductor device according to other embodiments of the present disclosure. It is understood that additional operations can be provided before, during, and after processes shown by FIGS. 18-22, and some of the operations described below can be replaced or eliminated, for additional embodiments of the method. The order of the operations/processes may be interchangeable. Materials, configurations, dimensions, processes, and/or operations the same as or similar to those explained with respect to FIGS. 2-17 may be employed in the following embodiments, and the detailed explanation thereof may be omitted.

Figure 19:
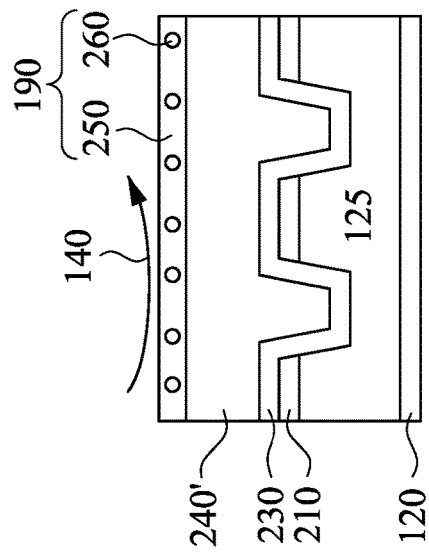
FIGS. 18, 19, 20, 21 and 22 show cross-sectional views of a method for manufacturing a semiconductor device, according to other embodiments of the present disclosure.
Figure 18:
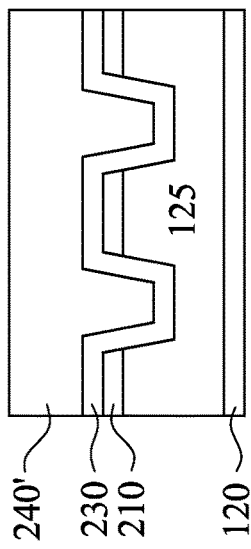

After the structure shown in FIG. 9 is formed, an CMP sacrificial layer 240' is formed over the CMP stop layer 210 as shown in FIG. 18. Unlike the structure shown in FIG. 10, in which the CMP sacrificial layer 240 is substantially conformally formed, a planar and thicker CMP sacrificial layer 240' is formed over the CMP stop layer 210. Accordingly, the CMP sacrificial layer 240' fully fills a concave portion of the CMP stop layer 210 in the trench T, and has a substantially flat surface (planar), as shown in FIG. 18. Then, similar to FIG. 11, a CMP operation is performed using a slurry 190 having abrasive particles 260 and a liquid 250 as shown in FIG. 19, and the structure shown in FIG. 12 is obtained. Since there is no convex portion in the CMP sacrificial layer 240', substantially no abrasive particle remains over the trenches after the CMP operation.

Figure 21:
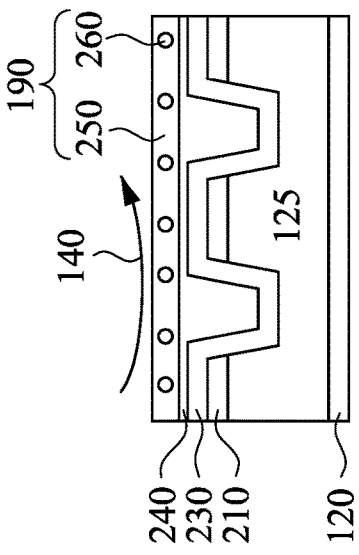
Figure 20:
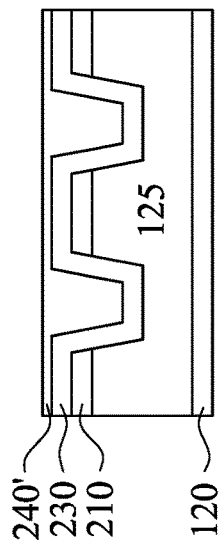

In some embodiments, after the planar CMP sacrificial layer 240' is formed as shown in FIG. 18, an etch-back operation is performed to reduce the thickness of the CMP sacrificial layer 240' as shown in FIG. 20. Then, similar to FIG. 11, a CMP operation is performed using a slurry 190 having abrasive particles 260 and a liquid 250 as shown in FIG. 21, and the structure shown in FIG. 12 is obtained. Since the thickness of the organic layer is reduced, it is possible to reduce process time of the CMP operation. Further, since there is no convex portion in the CMP sacrificial layer 240', substantially no abrasive particle remains over the trenches after the CMP operation.

Figure 22:
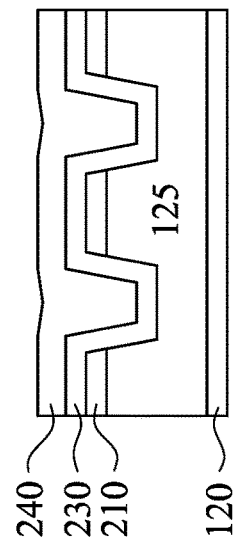

In some embodiments, after the CMP sacrificial layer 240 is formed as shown in FIG. 10, a thermal operation is performed to reflow the CMP sacrificial layer 240, as shown in FIG. 22. The thermal operation is performed at a temperature in a range from about 150° C. to about 200° C. in some embodiments, and in a range from about 170° C. to about 180° C. in other embodiments. By reflowing the CMP sacrificial layer 240, the concave portion in the trench T can be removed or reduced, and thus it is possible to prevent abrasive particle from remaining over the trenches.

Figure 23A:
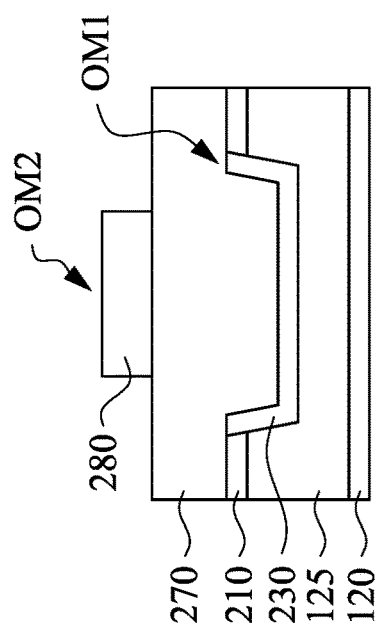
FIGS. 23A and 23B show an overlay measurement mark according to embodiments of the present disclosure.
Figure 23B:
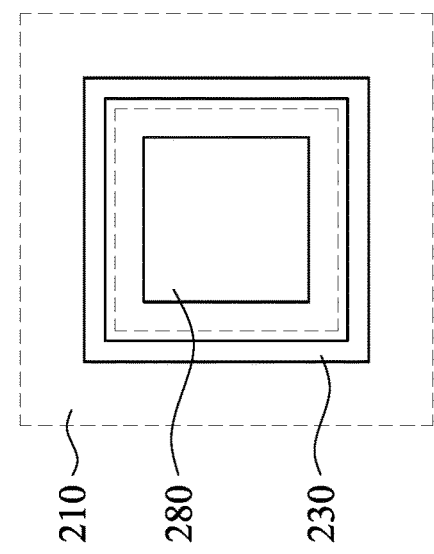

FIG. 23A is a cross sectional view and FIG. 23B is a plan view of an overlay measurement pattern according to an embodiment of the present disclosure. Materials, configurations, dimensions, processes, and/or operations the same as or similar to those explained with respect to FIGS. 2-21 may be employed in the following embodiments, and the detailed explanation thereof may be omitted.

The aforementioned technique can be applied not only to alignment marks but also to overlay measurement marks. In some embodiments, a lower layer, for example, a metal layer 230, includes a lower overlay measurement mark OM1. The lower overlay measurement mark OM1 is formed by the trench formed in a first ILD layer 125 and a metal layer 230. The metal layer 230 is formed by the operations explained with respect to FIGS. 2-13. Further, a second ILD layer 270 is formed over the lower overlay measurement mark OM1 and an upper overlay measurement mark OM2 is formed by a photo resist pattern 280. By measuring edges of the lower overlay measurement pattern OM1 and the upper overlay measurement pattern OM2, a relative distance between the lower overlay measurement pattern OM1 and the upper overlay measurement pattern OM2 is obtained as an overlay error. Since the lower overlay measurement pattern OM1 has clear and sharp edges as set forth above, signals from the lower overlay measurement pattern OM1 are strong and/or include less noise. Accordingly, more accurate overlay measurement is possible.

The above described methods can avoid dishing or curving of the layers such as metallic layer or dielectric layer after CMP. Especially, for metallic alignment marks provides device fabrication accuracy relying on the edges of the metallic alignment marks. The methods described above can avoid curving or dishing of the edges of the metallic alignment marks and can improve device fabrication accuracy.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a chemical and mechanical polishing (CMP) stop layer is formed on a substrate. A trench is formed in the substrate. A metal layer is formed on the CMP stop layer and in the trench. An organic layer is formed on the metal layer. CMP is performed to remove a portion of the metal layer, and ashing is performed to remove a remaining portion of the organic layer. A remaining portion of the metal layer is formed as an alignment mark for photo lithography. The organic layer includes one of photoresist and bottom anti-reflective coating (BARC). The ashing is plasma ashing. The operation of forming the trench comprises forming a photoresist layer on the CMP stop layer and performing etching to remove a portion of the substrate and a portion of the CMP stop layer so as to form a trench. An alignment mark is formed in the trench. The photoresist layer is patterned by a mask.

In accordance with an aspect of the present disclosure, in a method of manufacturing a semiconductor device, a first interlayer dielectric (ILD) layer is formed over a substrate, a chemical mechanical polishing (CMP) stop layer is formed over the first ILD layer, a trench is formed by patterning the CMP stop layer and the first ILD layer, a metal layer is formed over the CMP stop layer and in the trench, a sacrificial layer is formed over the metal layer, a CMP operation is performed on the sacrificial layer and the metal layer to remove a portion of the metal layer over the CMP stop layer, and a remaining portion of the sacrificial layer over the trench is removed. In one or more of the foregoing and following embodiments, the sacrificial layer includes an organic material. In one or more of the foregoing and following embodiments, the organic material includes one of photoresist and bottom anti-reflective coating (BARC). In one or more of the foregoing and following embodiments, the sacrificial layer is removed by a plasma ashing operation using an oxygen containing gas. In one or more of the foregoing and following embodiments, the sacrificial layer is removed by a wet cleaning operation using an organic solvent. In one or more of the foregoing and following embodiments, the metal layer is conformally formed in the trench such that the metal layer have a concave portion in the trench. In one or more of the foregoing and following embodiments, the CMP stop layer includes at least one of silicon-rich oxide and silicon carbide. In one or more of the foregoing and following embodiments, the CMP operation comprises applying a slurry including abrasive particles, and after the CMP operation, no abrasive particle remains over the trench. In one or more of the foregoing and following embodiments, after the sacrificial layer is formed, a surface of the sacrificial layer at a center of the trench is equal to or higher than an upper surface of the CMP stop layer. In one or more of the foregoing and following embodiments, a thickness of the sacrificial layer is in a range from 50 nm to 500 nm.

In accordance with another aspect of the present disclosure, in a method of manufacturing a semiconductor device, a first ILD layer is formed over a substrate, a CMP stop layer is formed over the first ILD layer, a trench is formed in a peripheral area and an opening is formed in a circuit area by patterning the CMP stop layer and the first ILD layer, a metal layer is formed over the CMP stop layer and in the trench, a sacrificial layer is formed over the metal layer, a CMP operation is performed on the sacrificial layer and the metal layer to remove a portion of the metal layer over the CMP stop layer, thereby forming a via contact in the circuit area, and a remaining portion of the sacrificial layer over the trench in the peripheral area is removed. In one or more of the foregoing and following embodiments, the sacrificial layer includes one of photoresist and BARC. In one or more of the foregoing and following embodiments, the sacrificial layer is removed by a plasma ashing operation using an oxygen containing gas. In one or more of the foregoing and following embodiments, the sacrificial layer is removed by a wet cleaning operation using an organic solvent. In one or more of the foregoing and following embodiments, the metal layer is conformally formed in the trench in the peripheral area such that the metal layer have a concave portion in the trench, and is formed to fully fill the opening in the circuit area. In one or more of the foregoing and following embodiments, the CMP stop layer includes at least one of silicon-rich oxide and silicon carbide. In one or more of the foregoing and following embodiments, the CMP operation comprises applying a slurry including abrasive particles, and after the CMP operation, no abrasive particle remains over the trench and no sacrificial layer remains in the circuit area. In one or more of the foregoing and following embodiments, after the sacrificial layer is formed, a surface of the sacrificial layer at a center of the trench is equal to or higher than an upper surface of the CMP stop layer. In one or more of the foregoing and following embodiments, a thickness of the sacrificial layer is in a range from 50 nm to 500 nm.

In accordance with another aspect of the present disclosure, a semiconductor device includes a metal wiring layer embedded in an ILD layer over a substrate, a via contact including a metal disposed on the metal wiring layer, and an alignment mark formed by a metal layer disposed in a trench formed in the ILD layer. The metal of the via contact and the metal layer of the alignment mark are made of a same material. The alignment mark has a U-shape cross section having a bottom part and sidewall parts. A top surface of at least one of the sidewall part has an angle with respect to a plane parallel to a surface of the substrate. The angle is more than 0 degrees and less than 5 degrees.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
an interlayer dielectric (ILD) layer disposed over the substrate;
a chemical mechanical polishing (CMP) stop layer formed on the ILD layer, the CMP stop layer being made of a different material than the ILD layer; and
a measurement mark comprising a metal layer disposed in a trench formed in the CMP stop layer and the ILD layer, wherein:
the metal layer has a U-shape cross section having a bottom part and sidewall parts,
a first angle between a plane parallel to an upper surface of the ILD CMP stop layer and a face of one of the sidewall parts of the metal layer is in a range from 50 degrees to 80 degrees,
a top surface of the one of the sidewall parts intersects the face of the one of the sidewall parts of the metal layer, and the top surface has a second angle with respect to the plane parallel to the upper surface of the CMP stop layer, and
the second angle is in a range from 5 degrees to 10 degrees.

2. The semiconductor device of claim 1, wherein a first depth of the measurement mark from the upper surface of the CMP stop layer to a top of the metal layer at the bottom part is in a range from 100 nm to 500 nm.

3. The semiconductor device of claim 1, wherein a second depth of the measurement mark from the upper surface of the CMP stop layer to a bottom of the metal layer at the bottom part is in a range from 50 nm to 1000 nm.

4. The semiconductor device of claim 1, wherein the CMP stop layer is made of silicon carbide.

5. The semiconductor device of claim 1, wherein the metal layer includes one or more layers of copper, aluminum, titanium, tungsten, nickel, cobalt, tantalum and an alloy thereof, TiN or TaN.

6. The semiconductor device of claim 1, wherein the trench comprises a bottom surface and opposing sidewall surfaces extending from the bottom surface to the upper surface of the CMP stop layer, the bottom part of the metal layer is disposed on the bottom surface of the trench and the sidewall parts of the metal layer are disposed on the opposing sidewall surfaces of the trench, and the second angle between the top surface of the at least one of the sidewall parts of the metal layer and the plane parallel to the upper surface of the CMP stop layer is less than any angles between the opposing sidewall surfaces of the trench and the plane parallel to the upper surface of the CMP stop layer.

7. The semiconductor device of claim 1, wherein the CMP stop layer includes silicon-rich oxide or silicon carbide.

8. The semiconductor device of claim 1, wherein the CMP stop layer includes silicon carbide.

9. A semiconductor device, comprising:
a substrate;
a lower layer disposed over the substrate;
a chemical mechanical polishing (CMP) stop layer formed on the lower layer, the CMP stop layer being made of a different material than the lower layer; and
a measurement mark formed by a metal layer having a U-shape including a bottom part and sidewall parts, and disposed in a trench formed in the CMP stop layer and the lower layer, wherein:
the trench comprises a bottom surface and opposing sidewall surfaces extending from the bottom surface to an opening of the trench at an upper surface of the CMP stop layer,
the bottom part of the metal layer is disposed on the bottom surface of the trench and the sidewall parts of the metal layer are disposed on the opposing sidewall surfaces of the trench,
top surfaces of the sidewall parts of the metal layer respectively intersect faces of the sidewall parts of the metal layer covering the opposing sidewall surfaces of the trench, at least one of the top surfaces has a first angle with respect to a plane parallel to the upper surface of the CMP stop layer,
the first angle is in a range from 5 degrees to 10 degrees, and
the first angle is less than any angles between the opposing sidewall surfaces of the trench and the plane parallel to the upper surface of the CMP stop layer.

10. The semiconductor device of claim 9, wherein:
the lower layer includes a dielectric material.

11. The semiconductor device of claim 10, wherein the lower layer is made of silicon oxide, silicon nitride, silicon oxynitride, silicon carbon nitride, silicon carbon oxynitride, or fluorine-doped silicate glass.

12. The semiconductor device of claim 9, wherein a second angle between the plane parallel to the upper surface of the CMP stop layer and one of the sidewall parts is less than 90 degrees.

13. The semiconductor device of claim 9, wherein the metal layer includes TiN or TaN.

14. The semiconductor device of claim 9, wherein a first depth of the measurement mark from the upper surface of the CMP stop layer to a top of the metal layer at the bottom part is in a range from 100 nm to 500 nm.

15. The semiconductor device of claim 9, wherein a second depth of the measurement mark from the upper surface of the CMP stop layer to a bottom of the metal layer at the bottom part is in a range from 50 nm to 1000 nm.

16. A semiconductor device, comprising:
a substrate;
a first insulating layer disposed over the substrate;
a chemical mechanical polishing (CMP) stop layer formed on the first insulating layer, the CMP stop layer being made of a different material than the first insulating layer;
a first metal layer embedded in the first insulating layer;
a metal contact disposed in the CMP stop layer and the first insulating layer and in contact with the first metal layer; and
a second metal layer having a concave shape disposed in a trench formed in the CMP stop layer and the first insulating layer,
wherein the trench comprises a bottom surface and opposing sidewall surfaces extending from the bottom surface to an opening of the trench as viewed in cross section,
the second metal layer includes a bottom part and opposing sidewall parts as viewed in cross section, the bottom part of the second metal layer contacts the bottom surface of the trench and the opposing sidewall parts of the second metal layer contact the opposing sidewall surfaces of the trench,
top surfaces of the opposing sidewall parts of the second metal layer respectively intersect opposing faces of the opposing sidewall parts of the second metal layer, the top surfaces have a first angle in a range from 5 degrees to 10 degrees with respect to a plane parallel to an upper surface of the CMP stop layer, and the first angle is less than any angles between the opposing sidewall surfaces of the trench and the plane parallel to the upper surface of the CMP stop layer, and a second angle between the plane parallel to the upper surface of the CMP stop layer and the sidewall parts of the second metal layer is in a range from 60 degrees to 80 degrees.

17. The semiconductor device of claim 16, wherein the metal contact and the second metal layer are made of a same material.

18. The semiconductor device of claim 16, wherein the first insulating layer includes one or more selected from the group consisting of a silicon oxide, a silicon nitride, a silicon oxynitride (Si—O—N), a silicon carbon nitride (Si—C—N), a silicon carbon oxynitride (Si—C—O—N), a fluorine-doped silicate glass (FSG), or a low-k dielectric material.

19. The semiconductor device of claim 16, wherein the CMP stop layer includes a silicon-rich oxide or silicon carbide.

20. The semiconductor device of claim 16, further comprising a second insulating layer filling a concavity formed by the concave shape of the second metal layer.

* * * * *